(12) United States Patent
Kim et al.

(10) Patent No.: US 11,467,484 B2
(45) Date of Patent: Oct. 11, 2022

(54) METHOD FOR INSPECTING A RETICLE, A METHOD FOR MANUFACTURING A RETICLE, AND A METHOD FOR MANUFACTURING A SEMICONDUCTOR DEVICE USING THE SAME

(71) Applicant: Samsung Electronics Co., Ltd., Suwon-si (KR)

(72) Inventors: Seulgi Kim, Hwaseong-si (KR); Hyonseok Song, Suwon-si (KR); Inyong Kang, Seoul (KR); Kangwon Lee, Hwaseong-si (KR); JuHyoung Lee, Hwaseong-si (KR); Eunsik Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 194 days.

(21) Appl. No.: 16/800,316

(22) Filed: Feb. 25, 2020

(65) Prior Publication Data
US 2021/0033958 A1 Feb. 4, 2021

(30) Foreign Application Priority Data
Jul. 31, 2019 (KR) .......................... 10-2019-0093406

(51) Int. Cl.
*G03F 1/22* (2012.01)
*G03F 7/20* (2006.01)
(Continued)

(52) U.S. Cl.
CPC .............. *G03F 1/22* (2013.01); *G03F 7/2004* (2013.01); *H01L 21/0274* (2013.01); *H01L 22/12* (2013.01); *G01N 2021/95676* (2013.01)

(58) Field of Classification Search
CPC .. G03F 7/706; G03F 7/70358; G03F 7/70691; G03F 7/2004; G03F 1/22; G03F 1/84; G03F 1/24; G03F 7/70608; G03F 7/70475; G03F 7/162; H01L 21/0274; H01L 22/12; H01L 21/67253; H01L 22/10; H01L 22/0035; G01N 2021/95676; G01B 11/0633
(Continued)

(56) References Cited

U.S. PATENT DOCUMENTS

| | | |
|---|---|---|
| 6,445,439 B1 | 9/2002 | McCullough |
| 6,806,006 B2 | 10/2004 | Lercel et al. |

(Continued)

FOREIGN PATENT DOCUMENTS

| | | |
|---|---|---|
| KR | 20010010889 A | 2/2001 |
| KR | 20020017629 A | 3/2002 |
| KR | 20060068649 A | 6/2006 |

*Primary Examiner* — Isiaka O Akanbi
(74) *Attorney, Agent, or Firm* — Harness, Dickey & Pierce, P.L.C.

(57) ABSTRACT

A method for inspecting a reticle including a reflective layer on a reticle substrate is provided. The method may include loading the reticle on a stage, cooling the reticle substrate to a temperature lower than a room temperature, irradiating a laser beam to the reflective layer on the reticle substrate, receiving the laser beam using a photodetector to obtain an image of the reflective layer, and detect a particle defect on the reflective layer or a void defect in the reflective layer based on the image of the reflective layer.

9 Claims, 14 Drawing Sheets

(51) Int. Cl.
  *H01L 21/66*    (2006.01)
  *H01L 21/027*   (2006.01)
  *G01N 21/956*   (2006.01)

(58) Field of Classification Search
  USPC .......................... 356/237.2–237.6, 399–401
  See application file for complete search history.

(56) References Cited

U.S. PATENT DOCUMENTS

| | | |
|---|---|---|
| 7,193,228 B2 | 3/2007 | Bowering et al. |
| 8,736,810 B2 | 5/2014 | Wilklow et al. |
| 8,753,788 B1* | 6/2014 | Yu .............................. G03F 1/72 |
| | | 430/30 |
| 9,164,388 B2 | 10/2015 | Chilese et al. |
| 9,442,397 B2 | 9/2016 | Hauf |
| 9,454,090 B2 | 9/2016 | Sun et al. |
| 2002/0041368 A1* | 4/2002 | Ota ..................... G03F 7/70258 |
| | | 250/548 |
| 2002/0070355 A1* | 6/2002 | Ota ....................... G03F 9/7003 |
| | | 430/311 |
| 2005/0259246 A1 | 11/2005 | Kang et al. |
| 2010/0045948 A1* | 2/2010 | Kraus ..................... G01N 21/55 |
| | | 355/30 |
| 2011/0176121 A1* | 7/2011 | Loopstra ............. G03F 7/70891 |
| | | 355/30 |
| 2015/0064611 A1* | 3/2015 | Shih ......................... G03F 1/24 |
| | | 430/5 |
| 2017/0189945 A1* | 7/2017 | LeClaire ................... G03F 1/82 |
| 2018/0149985 A1 | 5/2018 | Liu |
| 2019/0121248 A1 | 4/2019 | Nakiboglu et al. |

\* cited by examiner

METHOD FOR INSPECTING A RETICLE, A METHOD FOR MANUFACTURING A RETICLE, AND A METHOD FOR MANUFACTURING A SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2019-0093406, filed on Jul. 31, 2019, in the Korean Intellectual Property Office, the disclosure of which is hereby incorporated by reference in its entirety.

BACKGROUND

Embodiments of the inventive concepts relate to a method for manufacturing a semiconductor device, and more particularly, to a method for inspecting a reticle, a method for manufacturing a reticle, and a method for manufacturing a semiconductor device using the same.

Highly integrated semiconductor devices have been developed with the development of information technology. The integration density of semiconductor devices may be greatly affected by a wavelength of a light source of a photolithography process. The light source may be an I-line source, a G-line source, an excimer laser light source (e.g., KrF or ArF), or an extreme ultraviolet (EUV) light source of which a wavelength is shorter than that of the excimer laser light source. The photon energy of the EUV light source may be much greater than that of the excimer laser light source. The EUV light source may cause particle contamination and damage of an EUV reticle. The contaminated EUV reticle may be replaced with a new one or may be cleaned. The damaged EUV reticle may be replaced with a new one.

SUMMARY

Embodiments of the inventive concepts may provide a method for inspecting a reticle which is capable of increasing a signal-to-noise ratio of optical inspection and of minimizing damage of the reticle, a method for manufacturing a reticle, and a method for manufacturing a semiconductor device using the same.

In an aspect, a method for inspecting a reticle is provided. The reticle may include a reflective layer on a reticle substrate. The method may include loading the reticle on a stage, cooling the reticle substrate to a temperature lower than a room temperature, irradiating a laser beam to the reflective layer on the reticle substrate, receiving the laser beam using a photodetector to obtain an image of the reflective layer, and to detecting whether a particle defect exists on the reflective layer or a void defect exists in the reflective layer based on the image of the reflective layer.

In an aspect, a method for manufacturing a reticle may include forming a reflective layer on a reticle substrate and inspecting the reflective layer. The inspecting the reflective layer may include cooling the reticle substrate to a temperature lower than a room temperature, irradiating a laser beam to the reflective layer, receiving the laser beam using a photodetector obtain an image of the reflective layer, and detecting whether a defect in the reflective layer exists based on the image of the reflective layer.

In an aspect, a method for manufacturing a semiconductor device may include performing an exposure process using a reticle, inspecting the reticle, and storing the reticle. The reticle may include a reticle substrate, a reflective layer on the reticle substrate, and an absorption pattern on the reflective layer. The inspecting the reticle may include cooling the reticle substrate to a temperature lower than a room temperature, irradiating a laser beam to the reflective layer and the absorption pattern on the substrate, receiving the laser beam using a photodetector to obtain an image of the reflective layer and the absorption pattern, and detecting whether a particle exists on the reflective layer or on the absorption pattern, based on the image of the reflective layer and the absorption pattern.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
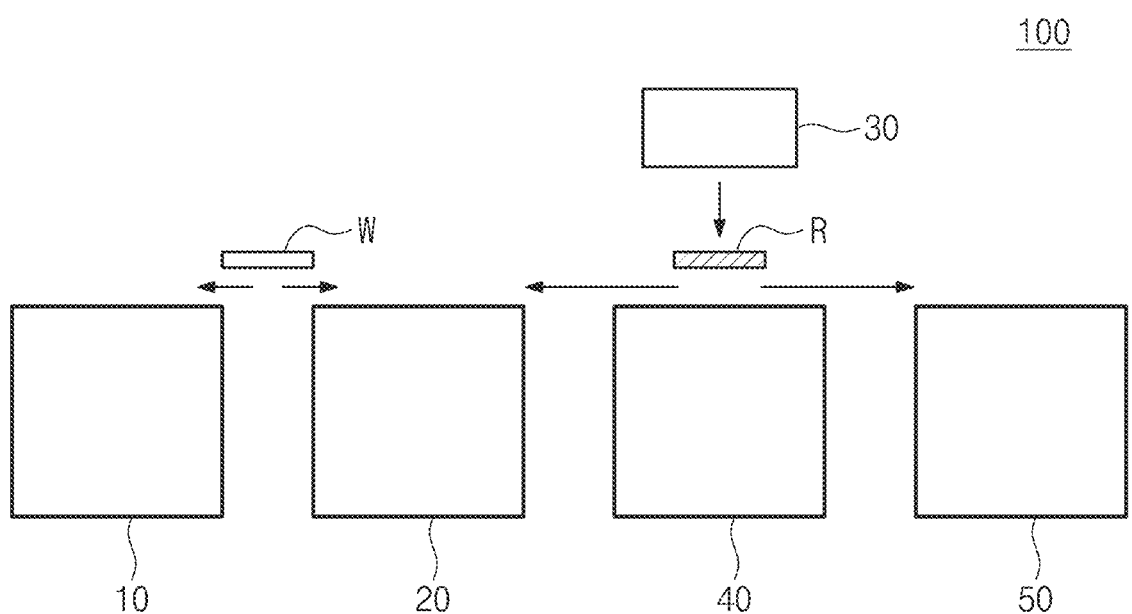
FIG. 1 is a block diagram illustrating an apparatus for manufacturing a semiconductor device, according to some embodiments of the inventive concepts.

FIG. 1 illustrates an apparatus 100 for manufacturing a semiconductor device, according to some embodiments of the inventive concepts.

Referring to FIG. 1, an apparatus 100 for manufacturing a semiconductor device according to some embodiments of the inventive concepts may be a photolithography apparatus.

The manufacturing apparatus 100 may be used to form a photoresist pattern on a substrate W. In some embodiments, the manufacturing apparatus 100 may include a spinner apparatus 10, an exposure apparatus 20, a reticle manufacturing apparatus 30, a reticle inspecting apparatus 40, and a reticle storing apparatus 50.

The spinner apparatus 10 may be disposed adjacent to the exposure apparatus 20. A substrate W may be transferred between the spinner apparatus 10 and the exposure apparatus 20. The substrate W may include a semiconductor wafer, such as a silicon wafer. The spinner apparatus 10 and the exposure apparatus 20 may form a photoresist pattern on the substrate W. The spinner apparatus 10 may perform a coating process, a bake process and a development process of a photoresist. The exposure apparatus 20 may perform an exposure process of the photoresist by using a reticle R. For example, the exposure apparatus 20 may be an extreme ultraviolet (EUV) exposure apparatus, and the reticle R may be an EUV reticle. In some embodiments, the spinner apparatus 10 may include a chuck for holding the wafer, one or more nozzles for performing the coating process and delivering chemicals during the developing process and a heater (e.g., heater plate) for performing the bake process.

The reticle manufacturing apparatus 30 may be used to manufacture the reticle R. Even though not shown in the drawings, the reticle manufacturing apparatus 30 may include a thin layer depositing module, a photoresist coating module, a photolithography module, an etching module, and a cleaning module. The thin layer depositing module may be used to deposit a thin layer (e.g., a silicon layer, a molybdenum layer, and/or an absorption layer) on a reticle substrate 2 (see FIG. 11). The photoresist coating module may be used to coat the reticle substrate 2 with a photoresist PR (see FIG. 11). The photolithography module may be used to pattern the coated photoresist PR. The etching module may be used to etch the thin layer (e.g., the absorption layer) along the patterned photoresist PR.

The reticle inspecting apparatus 40 may be disposed between the exposure apparatus 20 and the reticle storing apparatus 50. The reticle inspecting apparatus 40 may be used to inspect the reticle R. For example, the reticle inspecting apparatus 40 may detect a defect (e.g., a particle 8 of FIG. 5 and/or a void 9 of FIG. 11) of the reticle R.

The reticle storing apparatus 50 may store the reticle R temporarily and/or for a long time. The reticle R may be transferred to the exposure apparatus 20, the reticle manufacturing apparatus 30, the reticle inspecting apparatus 40, or the reticle storing apparatus 50 while being loaded in a reticle pod.

Figure 2:
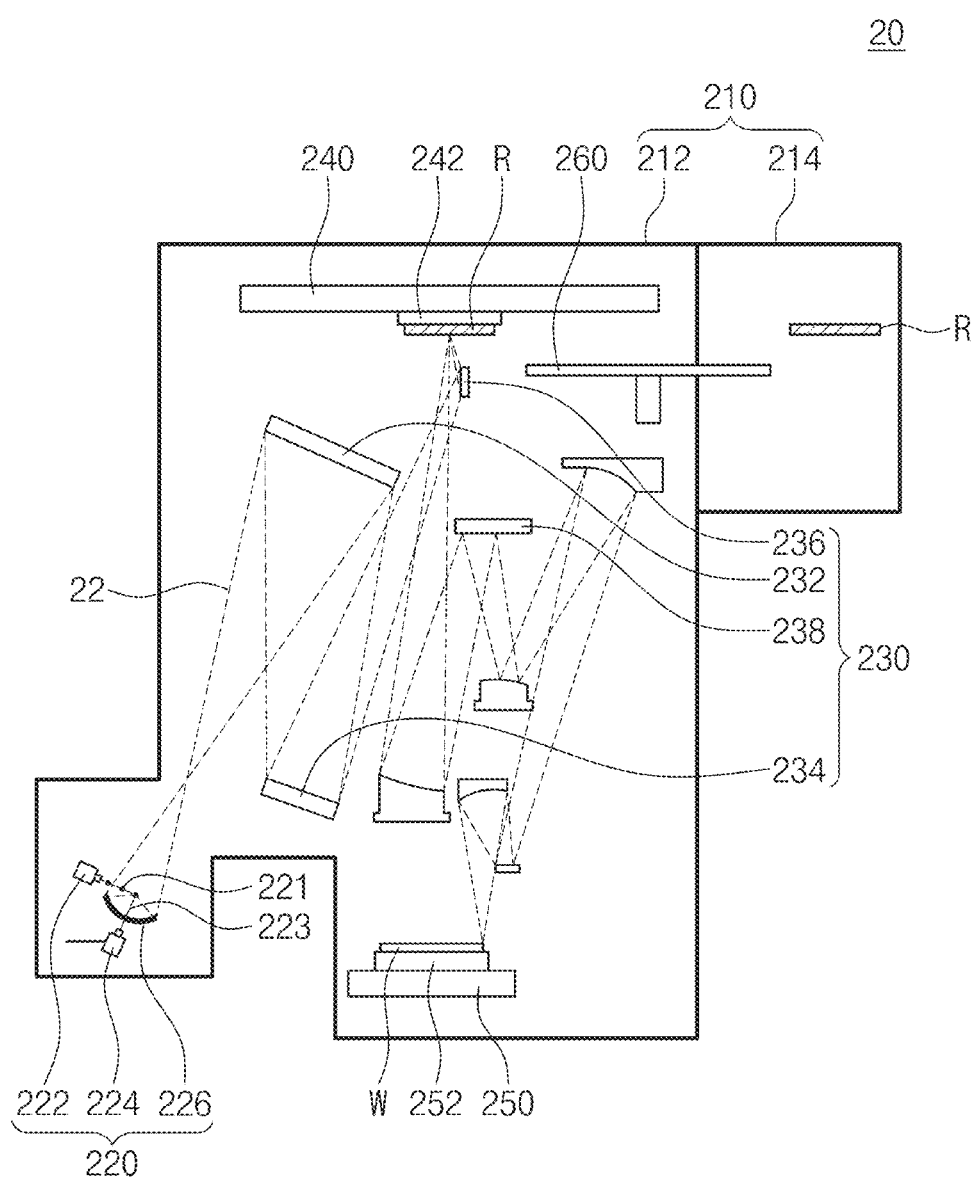
FIG. 2 is a schematic view illustrating an embodiment of an exposure apparatus of FIG. 1.

FIG. 2 illustrates an embodiment of the exposure apparatus 20 of FIG. 1.

Referring to FIG. 2, the exposure apparatus 20 may include an EUV scanner or an EUV stepper. For example, the exposure apparatus 20 may include a chamber 210, an EUV source 220, an optical system 230, a first reticle stage 240, a substrate stage 250, and a rapid exchange device 260.

The chamber 210 may provide an inner space into which the substrate W and the reticle R are loaded. The inner space of the chamber 210 may be independent of the outside when a process is performed. For example, the chamber 210 may have a vacuum pressure of, for example, $1 \times 10^{-4}$ Torr to $1 \times 10^{-6}$ Torr. When a gas (e.g., hydrogen) is injected into the chamber 210, the chamber 210 may have an inner pressure of, for example, $1 \times 10^{-2}$ Torr to $1 \times 10^{-4}$ Torr. The chamber 210 may include a main chamber 212 and an auxiliary chamber 214. The main chamber 212 may surround the EUV source 220, the optical system 230, the first reticle stage 240, and the substrate stage 250. The auxiliary chamber 214 may be connected to a side of the main chamber 212. The auxiliary chamber 214 may temporarily store the reticle R.

The EUV source 220 may be disposed in one side portion of the main chamber 212. The EUV source 220 may generate an EUV beam 22. The EUV beam 22 may be a plasma beam. In some embodiments, the EUV source 220 may include a source drop generator 222, a first laser 224, and a collector mirror 226. The source drop generator 222 may generate a source drop 221. The source drop 221 may include a metal liquid drop of tin (Sn), xenon (Xe), titanium (Ti) or lithium (Li). The first laser 224 may irradiate a first laser beam 223 to the source drop 221 to generate the EUV beam 22. The first laser beam 223 may be pump light of the EUV beam 22. An intensity of the EUV beam 22 may be in proportion to an intensity or power of the first laser beam 223. The collector mirror 226 may focus or concentrate the EUV beam 22 to the optical system 230. For example, the collector mirror 226 may include a concave mirror.

The optical system 230 may be disposed between the first reticle stage 240 and the substrate stage 250. The optical system 230 may sequentially provide the EUV beam 22 to the reticle R and the substrate W. For example, the optical system 230 may include a field facet mirror 232, a pupil facet mirror 234, a grazing mirror 236, and projection mirrors 238. The field facet mirror 232, the pupil facet mirror 234 and the grazing mirror 236 may be used as an illumination system for providing the EUV beam 22 to the reticle R. The field facet mirror 232 may reflect the EUV beam 22 to the pupil facet mirror 234. The pupil facet mirror 234 may reflect the EUV beam 22 toward the reticle R. The field facet mirror 232 and the pupil facet mirror 234 may collimate the EUV beam 22. The grazing mirror 236 may be disposed between the pupil facet mirror 234 and the reticle R. The grazing mirror 236 may adjust a grazing incident angle of the EUV beam 22. The projection mirrors 238 may be used as a projection objective for providing the EUV beam 22 to the substrate W. The projection mirrors 238 may provide the EUV beam 22 to the substrate W.

The first reticle stage 240 may be disposed in an upper region of the inner space of the main chamber 212. The first reticle stage 240 may have a reticle chuck 242. The reticle chuck 242 may electrostatically hold the reticle R by using an electrostatic voltage. For example, the reticle R may be a reflective mask. The reticle R may reflect a portion of the EUV beam 22 to the projection mirrors 238 and may absorb another portion of the EUV beam 22. The projection mirrors 238 may reflect the reflected portion of the EUV beam 22 to the substrate W. The reticle R may be contaminated by a material for generating the EUV beam 22 (e.g., the material of the source drop 221). For example, the reticle R may be contaminated by particles 8. For example, the particles 8 may be metal nanoparticles of tin (Sn), xenon (Xe), titanium (Ti), or lithium (Li).

The substrate stage 250 may be disposed in a lower region of the inner space of the main chamber 212. The substrate stage 250 may have a substrate chuck 252. The substrate chuck 252 may receive the substrate W. The substrate chuck 252 may electrostatically hold the substrate W. The substrate W may be exposed to the EUV beam 22. A photoresist on the substrate W may be partially exposed to the EUV beam 22 along a pattern of the reticle R.

The rapid exchange device 260 may be disposed between the first reticle stage 240 in the main chamber 212 and the auxiliary chamber 214. The rapid exchange device 260 may exchange the reticle R on the reticle chuck 242. The rapid exchange device 260 may transfer the reticle R between the reticle chuck 252 and the auxiliary chamber 214.

Figure 3:
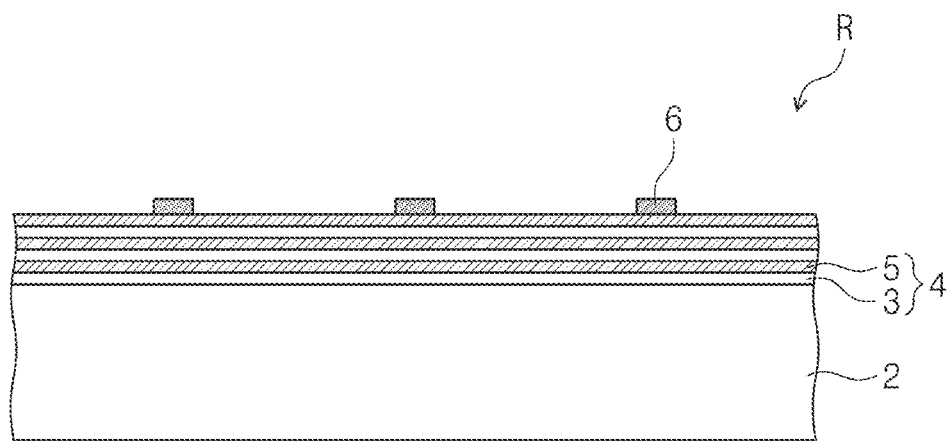
FIG. 3 is a cross-sectional view illustrating an embodiment of a reticle of FIG. 2.

FIG. 3 illustrates an embodiment of the reticle R of FIG. 2.

Referring to FIG. 3, the reticle R may be a reflective photomask. In some embodiments, the reticle R may include a reticle substrate 2, a reflective layer 4, and an absorption pattern 6.

The reticle substrate 2 may include quartz. Alternatively, the reticle substrate 2 may include a metal or a glass. However, embodiments of the inventive concepts are not limited thereto. The reticle substrate 2 may have a thickness of about 2 mm to about 5 mm.

The reflective layer 4 may be repeatedly stacked about 40 to 50 times on the reticle substrate 2. The reflective layer 4 may reflect the EUV beam 22. The reflective layer 4 may have a thickness of about 14 nm. The reflective layer 4 may include a silicon layer 3 and a molybdenum layer 5. The silicon layer 3 and the molybdenum layer 5 may be alternately stacked on the reticle substrate 2.

The absorption pattern 6 may be disposed on the reflective layer 4. The absorption pattern 6 may absorb the EUV beam 22. The absorption pattern 6 may include tantalum. The absorption pattern 6 may have a thickness of about 50 nm to about 60 nm.

Figure 4:
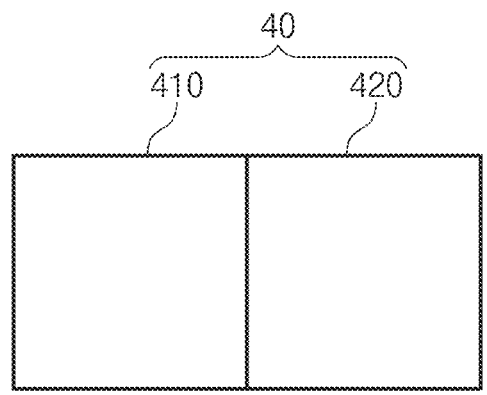
FIG. 4 is a block diagram illustrating an embodiment of a reticle inspecting apparatus of FIG. 1.

FIG. 4 illustrates an embodiment of the reticle inspecting apparatus 40 of FIG. 1.

Referring to FIG. 4, the reticle inspecting apparatus 40 may include a reticle inspecting module 410 and a reticle cleaning module 420. The reticle inspecting module 410 may be disposed at a side of the reticle cleaning module 420. The reticle inspecting module 410 may inspect the particle 8 (see FIG. 5) of the reticle R. For example, the reticle inspecting module 410 may detect a defect (e.g., the particle 8 of FIG. 5 and/or the void 9 of FIG. 11) of the reticle R. When the particle 8 exists on the reticle R, the reticle cleaning module 420 may clean the reticle R to remove the particle 8. The reticle inspecting module 410, such as examples in FIGS. 4 and 7, may include an optical spectroscope, but is not limited thereto.

Figure 5:
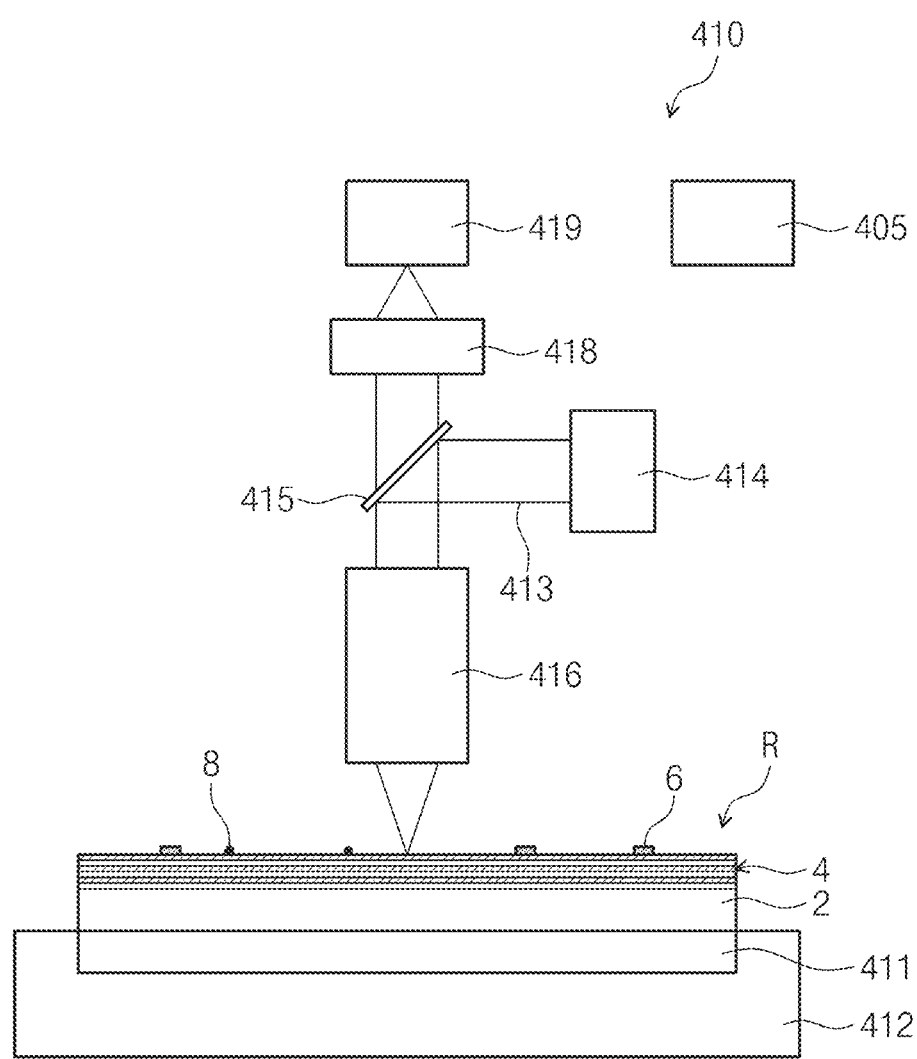
FIG. 5 is a cross-sectional view illustrating an example of the reticle inspecting module of FIG. 4 according to an embodiment.

FIG. 5 illustrates an embodiment of the reticle inspecting module 410 of FIG. 4.

Referring to FIG. 5, the reticle inspecting module 410 may include a second reticle stage 412, a second laser 414, a half mirror 415, an objective 416, an eyepiece 418, and a photodetector 419.

The second reticle stage 412 may receive the reticle substrate 2. The second reticle stage 412 may have a substrate cooler 411. For example, the substrate cooler 411 may include a Peltier device. The substrate cooler 411 may cool the reticle R.

The second laser 414 may generate a second laser beam 413. The second laser beam 413 may include ArF ultraviolet light (e.g., 193 nm). The second laser 414 may provide the second laser beam 413 to the half mirror 415.

The half mirror 415 may be disposed between the objective 416 and the eyepiece 418. The half mirror 415 may reflect the second laser beam 413 to the objective 416.

The objective 416 may be disposed between the half mirror 415 and the second reticle stage 412. The objective 416 may irradiate the second laser beam 413 to the reflective layer 4 and the absorption pattern 6 of the reticle R. The second laser beam 413 may be focused on the reflective layer 4 and the absorption pattern 6. The focused second laser beam 413 may be reflected from the reflective layer 4 and the absorption pattern 6 and then may be provided to the objective 416. The objective 416 may provide the reflected second laser beam 413 to the half mirror 415. The half mirror 415 may transmit the second laser beam 413 to the eyepiece 418.

The eyepiece 418 may be disposed between the half mirror 415 and the photodetector 419. The eyepiece 418 may focus the transmitted second laser beam 413 on the photodetector 419.

The type of photodetector 419 is not particularly limited and may include an image sensor circuit, photodiode, CCD device for detecting defects on a reticle, including an EUV reticle. In example embodiments, the reticle inspecting module 410 of FIG. 4 (or FIG. 7) may further include a controller 405 for controlling operations of the reticle inspecting module 410 in FIG. 4 (or air blowing device 417 in FIG. 7).

The photodetector 419 may receive the second laser beam 413, based on a portion of the second laser beam 413 reflected and/or scattered after being irradiated onto the reticle R, and generate signals based on receiving the second laser beam 413. As discussed below, the controller 405, based on signals from the photodetector 419, may obtain and/or generate an image of the reticle R and determine whether a defect (e.g., the particle 8) exists on the reticle R or not. Alternatively, the controller 405, based on signals from the photodetector 419, may determine whether the reticle R is damaged or not.

The controller 405 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The controller 405 may control the photodetector 419, second laser 414, and substrate cooler 411 in FIG. 4 (or air blowing device 417 in FIG. 7) to generate the image of the reticle R (and/or portion thereof) based on the reflected and/or scattered portion of the second laser beam 413 that the photodetector 419 receives when the second laser 414 irradiates the reticle R (and/or portion thereof) with the second laser beam 413.

As discussed below, based on the controller 405 controlling the reticle inspecting module 410 so the substrate cooler 411 in FIG. 4 (or air blowing device 417 in FIG. 7) cools the reticle R while the second laser 414 irradiates the second laser beam 413 to the reticle R, the controller 405 may be transformed into a special-purpose controller 405 that improves the functioning the reticle inspecting module 410. The controller 405 may improve the functioning of the reticle inspection module 410 because the power of the second laser beam 413 irradiated to the reticle R may be increased without damaging the reticle R when the substrate cooler 411 in FIG. 4 or the air blowing device 417 in FIG. 7) cools the reticle R.

Figure 17:
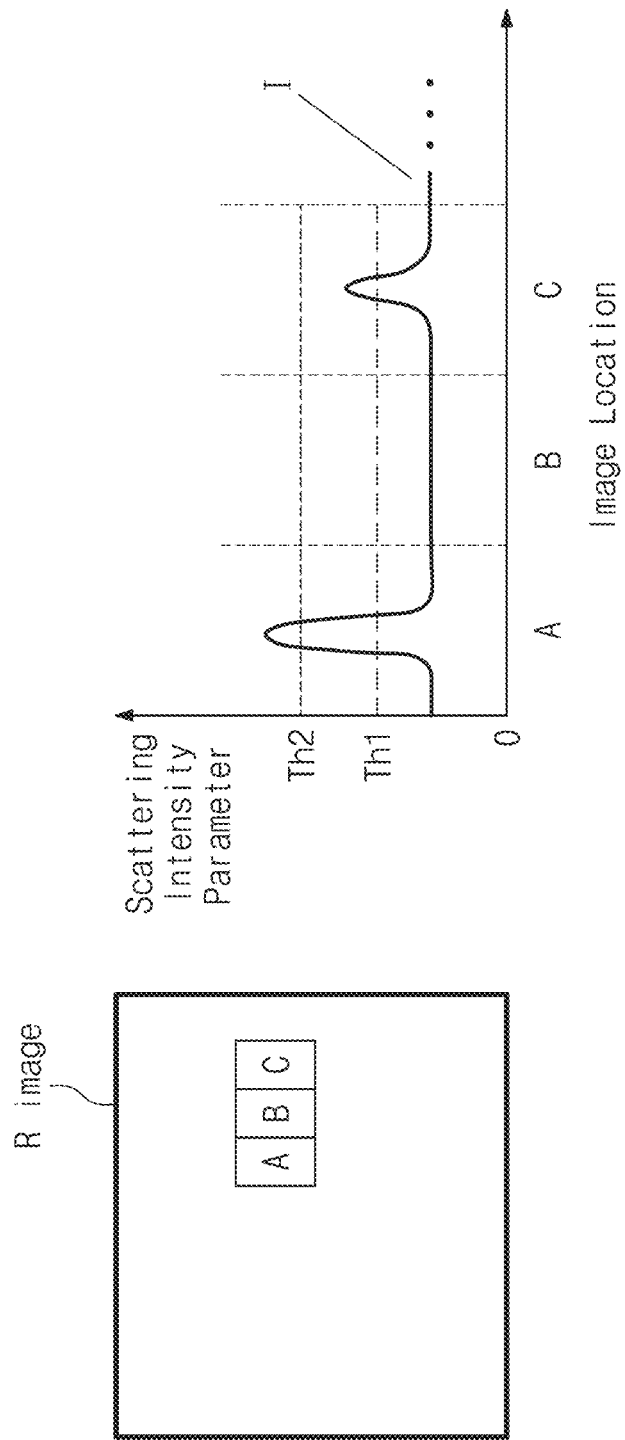
FIG. 17 is an example of a scattering intensity profile of an image generated by a reticle inspecting apparatus according to some embodiments of the inventive concepts.

In example embodiments, the controller 405 may operate the reticle inspecting module 410 to determine whether a portion of the reticle R (e.g., the reflective layer 4) has one or more defects (e.g., the particle 8 in FIG. 5 or the void 9 in FIG. 11) based on a scattering intensity profile of the reticle image Rimage generated using signals from the photodetector 419. For example, as shown in FIG. 17, the reticle image Rimage generated by the controller 405 using the photodetector 419 may include levels of a scattering intensity parameter at corresponding locations (e.g., locations A, B, C) of the reticle image Rimage. In some embodiments, the scattering intensity parameter at a corresponding location may be based on the detection signal the photodetector 419 generates in response to the reflected and/or scattered portion of the second laser beam 413 that the photodetector 419 receives as the second laser beam 413 irradiates the corresponding location of the reticle R. In other embodiments, the scattering intensity parameter associated with a corresponding location of the reticle image Rimage may be based further on a relationship (e.g., difference) between a reference detection signal for the corresponding location in a reference reticle image (not shown) and the detection signal of the photodetector 419 generates in response to the reflected and/or scattered portion of the second laser beam 413 that the photodetector 419 receives as the second laser beam 413 irradiates the corresponding location of the reticle R.

In some embodiments, the controller 405, using signals from the photodetector 419, may determine a defect of a first type (e.g., void 9 in FIG. 11) exists in a portion of the reticle R (e.g., reflective layer 4) in response to the scattering intensity parameter I being greater than or equal to a first threshold Th1 and less than or second threshold Th2 (see location C); no defect exists in response to the scattering intensity parameter I being less than or equal to the first threshold Th1 and less than the second threshold (see location B); and a defect of a second type (e.g., particle 8 in FIG. 5) exists in response to the scattering intensity parameter I being greater than or equal to a second threshold Th2 (see location A). However, inventive concepts are not limited thereto.

Figure 7:
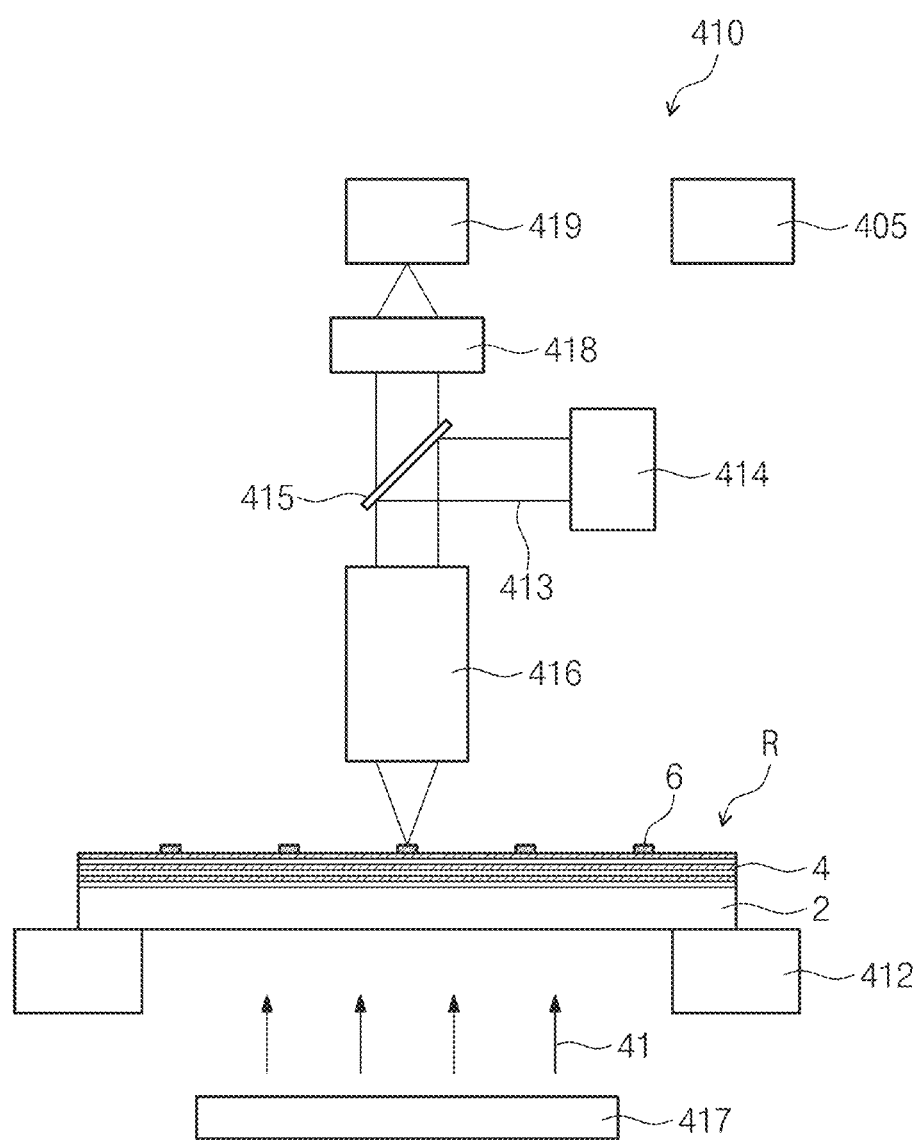
FIG. 7 is a cross-sectional view illustrating an example of the reticle inspecting module of FIG. 4 according to an embodiment.

For example, referring to FIGS. 4 and 7, the image of the reticle R may have a resolution proportional to power of the second laser beam 413. In other words, a detection signal of the photodetector 419 may be in proportion to the power of the second laser beam 413, and a noise may be in proportion to a square root of the power of the second laser beam 413. For example, a signal-to-noise (S/N) ratio of the photodetector 419 may be increased in proportion to a ratio of the power of the second laser beam 413 to the square root of the power.

A portion of the second laser beam 413 may be absorbed in the reflective layer 4 and the absorption pattern 6. When the power of the second laser beam 413 is increased, the reflective layer 4 of the reticle R may be excessively heated to cause intermixing failure of the silicon layer 3 and the molybdenum layer 5. When the intermixing failure occurs, a reflectance of the EUV beam 22 (see FIG. 2) may be reduced in the exposure apparatus. According to some embodiments of the inventive concepts, the controller 405 may operate the substrate cooler 411 to cool the reticle substrate 2 and the reflective layer 4, and thus the S/N ratio may be increased and damage (e.g., the intermixing failure) of the reflective layer 4 may be reduced and/or minimized.

For example, an intermixing occurrence temperature of the silicon layer 3 and the molybdenum layer 5 may be about 200 degrees Celsius. If the power of the second laser beam 413 is 0.5 W/cm² or more, the silicon layer 3 and the molybdenum layer 5 at room temperature (or normal temperature, e.g., 15 degrees Celsius) may be heated to 200 degrees Celsius or more, thereby causing the intermixing failure. When the power of the second laser beam 413 is about 0.49 W/cm², the reflective layer 4 may be heated to about 200 degrees Celsius. The maximum value of the power of the second laser beam 413 may be about 0.49 W/cm² with respect to the silicon layer 3 and the molybdenum layer 5 at the room temperature (e.g., 15 degrees Celsius).

When the substrate cooler 411 cools the reticle R, the maximum value of the power of the second laser beam 413 may be increased. When the silicon layer 3 and the molybdenum layer 5 are cooled by about 18.5 degrees Celsius and thus have a temperature of about −3.5 degrees Celsius, the maximum value of the power of the second laser beam 413 may be increased by about 10%. In this case, the power of the second laser beam 413 may be about 0.539 W/cm². When the silicon layer 3 and the molybdenum layer 5 are cooled by about 37 degrees Celsius and thus have a temperature of about −22 degrees Celsius, the maximum value of the power of the second laser beam 413 may be increased by about 20%. In this case, the power of the second laser beam 413 may be about 0.588 W/cm².

On the other hand, the reflective layer 4 may have a heat capacity which decreases as a temperature decreases. When the substrate cooler 411 cools the reticle R, the heat capacity of the reflective layer 4 may be reduced. When the heat capacity of the reflective layer 4 is reduced, a temperature of the reticle R may increase more rapidly as the power of the second laser beam 413 increases. In addition, as the reflective layer 4 is cooled, an energy required for cooling the reflective layer 4 may increase, so that a cooling rate of the reflective layer 4 may be reduced. When the cooling rate of the reflective layer 4 is reduced, the substrate cooler 411 may not easily cool the reflective layer 4 and the power of the second laser beam 413 may not be increased.

Figure 6:
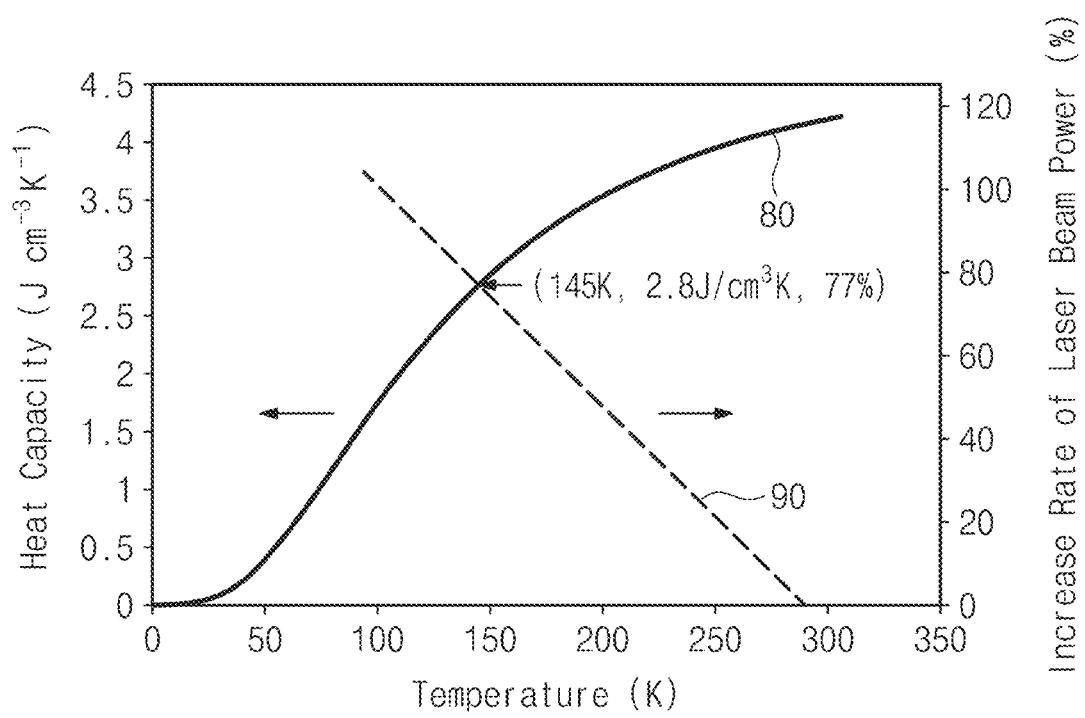
FIG. 6 is a graph showing a heat capacity of a reflective layer and an increase rate of second laser beam power, according to a temperature of the reticle of FIG. 2.

FIG. 6 shows a heat capacity 80 of the reflective layer 4 and an increase rate 90 of the power of the second laser beam 413, according to a temperature of the reticle R of FIG. 2.

Referring to FIG. 6, the heat capacity 80 of the reflective layer 4 may be in proportion to the temperature, and the increase rate 90 of the power of the second laser beam 413 may be in inverse proportion to the temperature. As the temperature of the reflective layer 4 decreases, the heat capacity 80 of the reflective layer 4 may decrease and the increase rate 90 of the power of the second laser beam 413 may increase. When the temperature of the reflective layer 4 decreases below about 145 kelvins (K) (e.g., −128 degrees Celsius), the heat capacity 80 of the reflective layer 4 may decrease rapidly. For example, a gradient of the heat capacity 80 of the reflective layer 4 may be less than about 0.01 at a temperature of about 145 kelvins (K) or more and may be equal to or greater than about 0.01 at a temperature of about 145 kelvins (K) to about 50 kelvins (K). The reflective layer 4 may be easily cooled at a temperature of about 145 kelvins (K) or more but may not be easily cooled at a temperature of about 145 kelvins (K) or less. At a temperature of about 145 kelvins (K), the heat capacity 80 of the reflective layer 4 may be about 2.8 J/cm³K, and the increase rate 90 of the power of the second laser beam 413 may be about 77%. The power of the second laser beam 413 may be calculated as a sum of the maximum value (0.49 W/cm²) at the room temperature (288 kelvins (K) or 15 degrees Celsius) and the increase rate 90 of 77% (0.38 W/cm²). As a result, the power of the second laser beam 413 may be increased to about 0.87 W/cm².

When the reflective layer 4 is cooled to 145 kelvins (K) or less, the power of the second laser beam 413 may be increased to about 0.87 W/cm² or more. However, the heat capacity 80 of the reflective layer 4 may be reduced to easily cause the intermixing failure of the silicon layer 3 and the molybdenum layer 5 of the reflective layer 4.

At the room temperature (e.g., 288 kelvins (K) or 15 degrees Celsius), the heat capacity 80 of the reflective layer 4 may be about 4 J/cm³K and the increase rate 90 of the power of the second laser beam 413 may be 0%. The maximum value (0.49 W/cm²) of the power of the second laser beam 413 may be provided.

FIG. 7 illustrates an embodiment of the reticle inspecting module 410 of FIG. 4.

Referring to FIG. 7, a second reticle stage 412 of a reticle inspecting module 410 may include an air blowing device 417. A back surface of the reticle substrate 2 received on the second reticle stage 412 may be exposed to the air blowing device 417. The air blowing device 417 may be a cooler for cooling the reticle substrate 2. The air blowing device 417, under the control of the controller 405, may provide cooling air 41 to the back surface of the reticle substrate 2 to cool the reflective layer 4 disposed on the reticle substrate 2. A second laser 414, a half mirror 415, an objective 416, an eyepiece 418 and a photodetector 419 may be the same as described with reference to FIG. 5.

Figure 8:
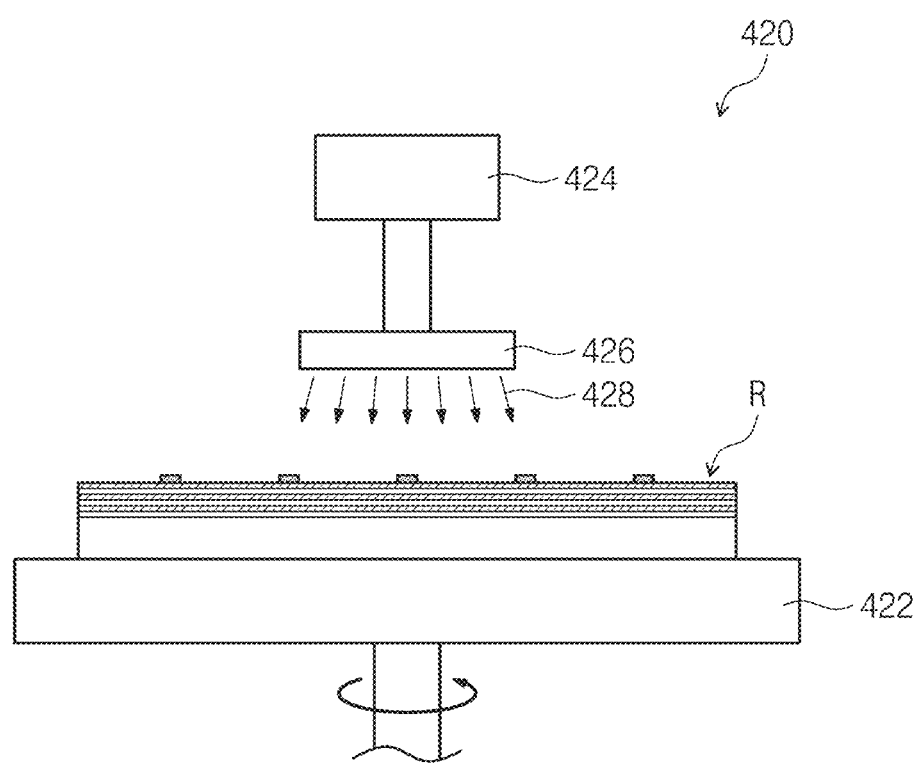
FIG. 8 is a cross-sectional view illustrating an embodiment of a reticle cleaning module of FIG. 4.

FIG. 8 illustrates an embodiment of the reticle cleaning module 420 of FIG. 4.

Referring to FIG. 8, the reticle cleaning module 420 may include a wet cleaning module such as a spin wet cleaning apparatus or a dip wet cleaning apparatus. Alternatively, the reticle cleaning module 420 may include, but not limited to, a dry cleaning module. In some embodiments, the reticle cleaning module 420 may include a spin chuck 422, a cleaning solution supply unit 424, and a cleaning solution nozzle 426. The spin chuck 422 may rotate the reticle R. The cleaning solution supply unit 424 may supply a cleaning solution 428 to the cleaning solution nozzle 426. The cleaning solution nozzle 426 may be disposed over the spin chuck 422. The cleaning solution nozzle 426 may be connected to the cleaning solution supply unit 424. The cleaning solution nozzle 426 may provide the cleaning solution 428 onto the reticle R to clean the reticle R.

A method for manufacturing a semiconductor device by using the manufacturing apparatus 100 described above will be described hereinafter.

Figure 9:
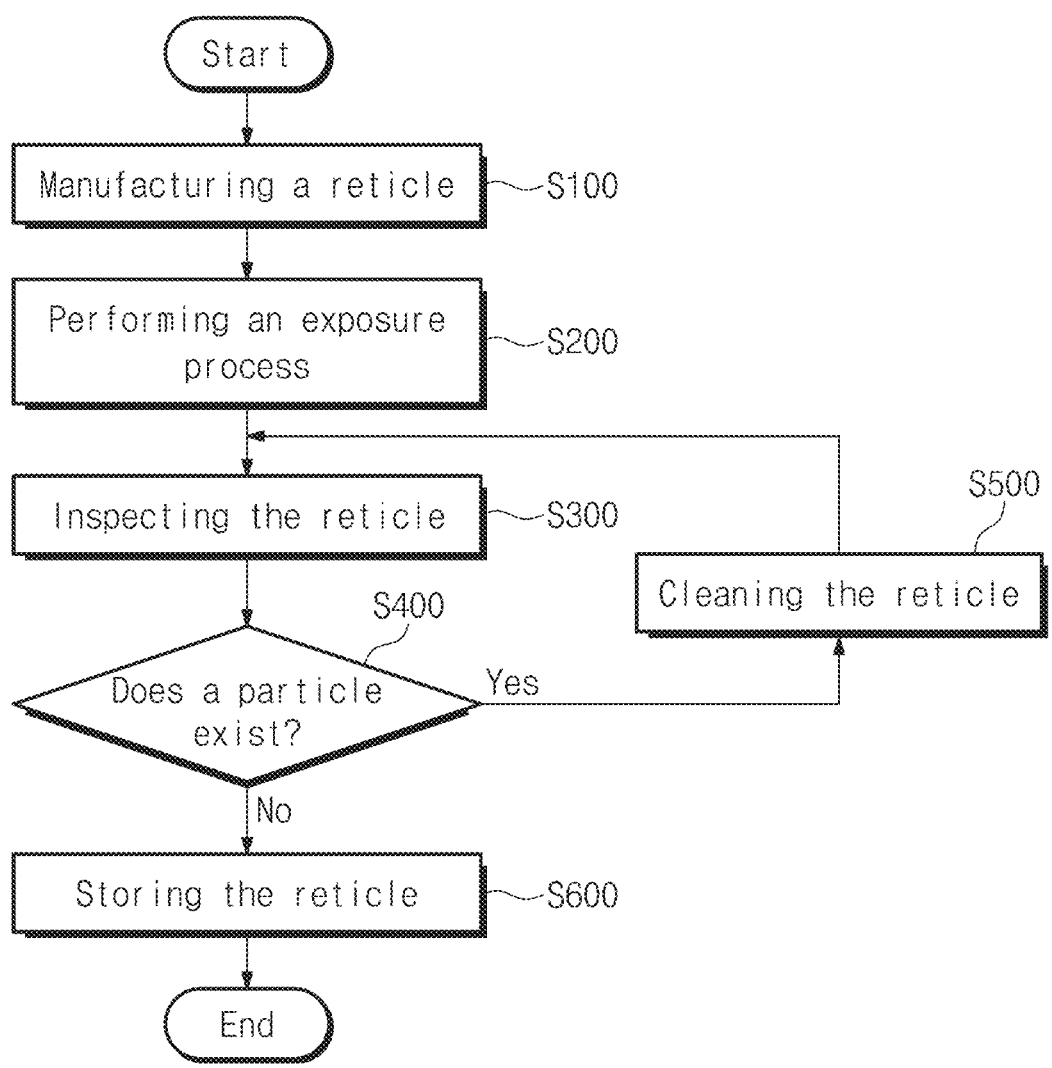
FIG. 9 is a flowchart illustrating a method for manufacturing a semiconductor device, according to some embodiments of the inventive concepts.

FIG. 9 illustrates a method for manufacturing a semiconductor device, according to some embodiments of the inventive concepts.

Referring to FIG. 9, a method for manufacturing a semiconductor device according to some embodiments of the inventive concepts may include manufacturing a reticle R (S100), performing an exposure process (S200), inspecting the reticle R (S300), determining whether a particle 8 exists or not (S400), cleaning the reticle R when the particle 8 exists (S500), and storing the reticle R (S600).

First, the reticle R may be manufactured by the reticle manufacturing apparatus 30 (S100).

Figure 10:
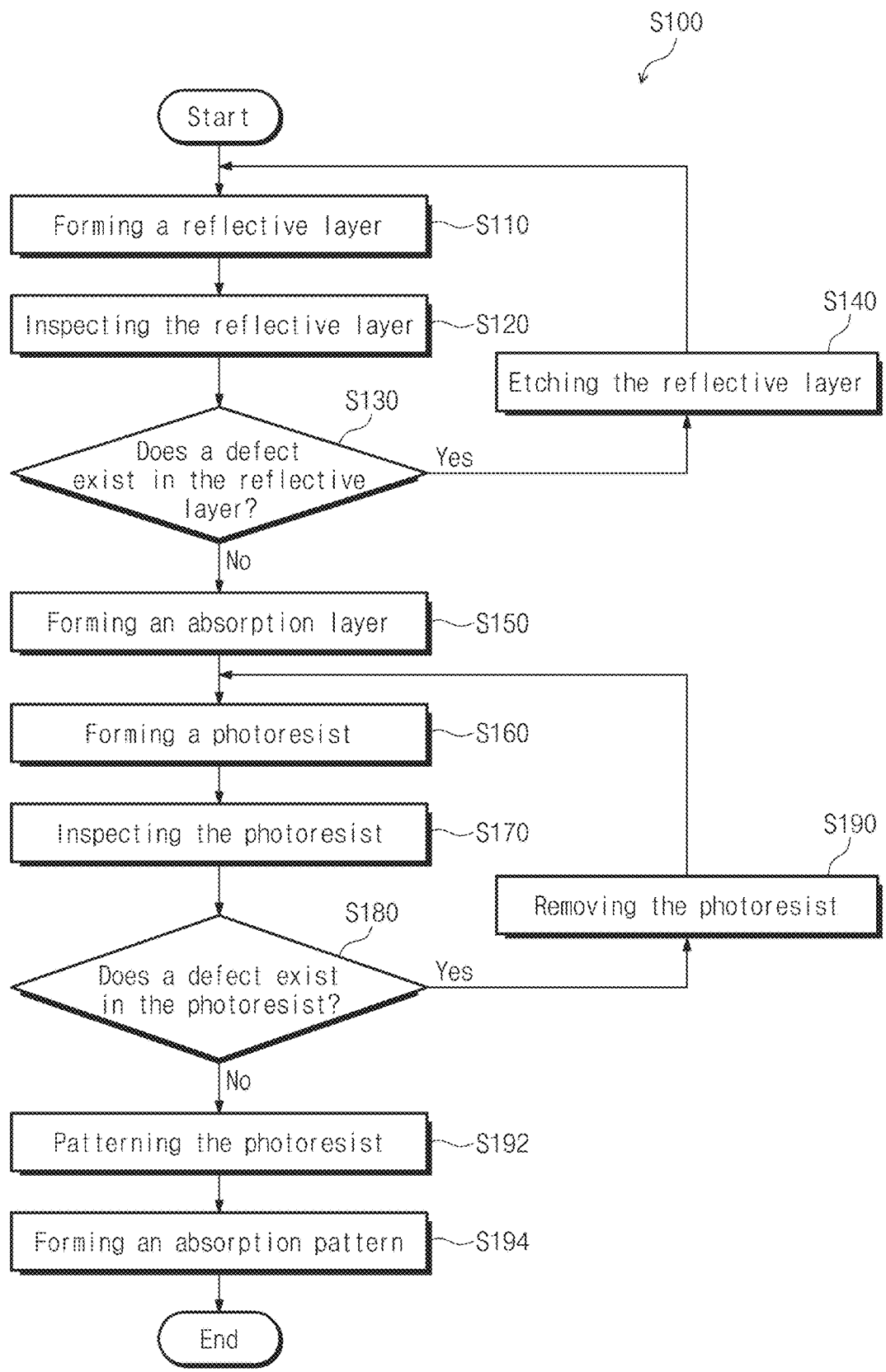
FIG. 10 is a flowchart illustrating a method for manufacturing the reticle of FIG. 2, according to some embodiments of the inventive concepts.

FIG. 10 illustrates the operation S100 of manufacturing the reticle R of FIG. 2, according to some embodiments of the inventive concepts.

Referring to FIG. 10, the operation S100 of manufacturing the reticle R may include forming a reflective layer 4 (S110), inspecting the reflective layer 4 (S120), determining whether a defect exists in the reflective layer 4 or not (S130), etching the reflective layer 4 (S140), forming an absorption layer (S150), forming a photoresist (S160), inspecting the photoresist (S170), determining whether a defect exists in the photoresist or not (S180), removing the photoresist (S190), patterning the photoresist (S192), and forming an absorption pattern 6 (S194).

Hereinafter, the operation S100 of manufacturing the reticle R will be described in more detail.

Figure 11:
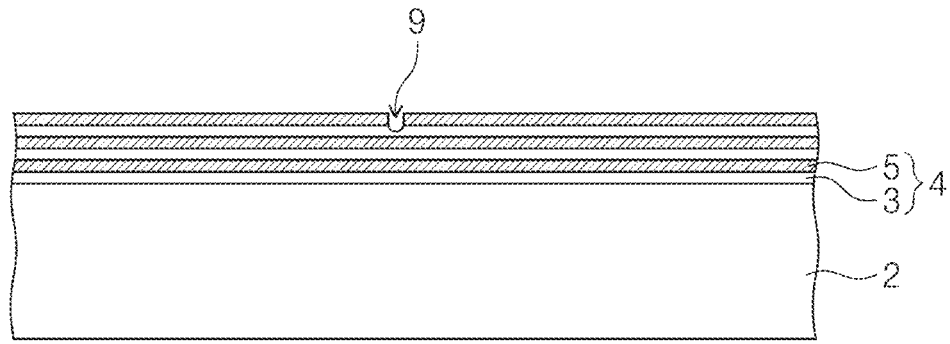
FIGS. 11 to 13 are process cross-sectional views of the reticle of FIG. 3.
Figure 12:
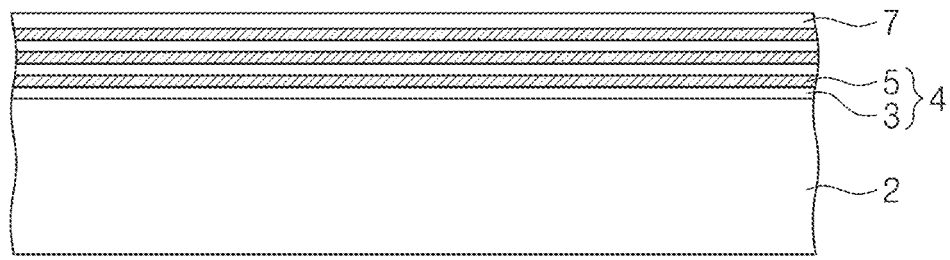
Figure 13:
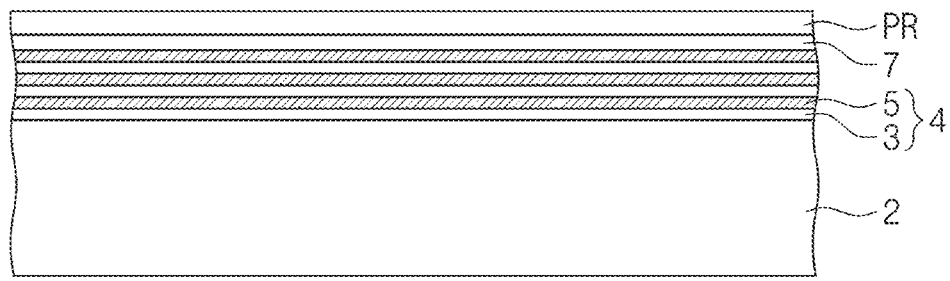

FIGS. 11 to 13 are process cross-sectional views of the reticle R of FIG. 3.

Referring to FIGS. 10 and 11, the thin layer depositing module of the reticle manufacturing apparatus 30 may form the reflective layer 4 on the reticle substrate 2 (S110). The reflective layer 4 may include a silicon layer 3 and a molybdenum layer 5. The silicon layer 3 may be formed by a chemical vapor deposition (CVD) method. The molybdenum layer 5 may be formed by a sputtering method or a CVD method.

Next, the reticle inspecting module 410 of the reticle inspecting apparatus 40 may inspect the reflective layer 4 (S120). The reflective layer 4 may be inspected by an optical inspection method. The reticle inspecting module 410 may obtain a surface image of the reflective layer 4 to detect a defect. For example, the defect may include a particle 8 (see FIG. 5). Alternatively, the defect may include, but not limited to, a void 9 (see FIG. 11), a bump or a pit of the reflective layer 4.

Figure 14:
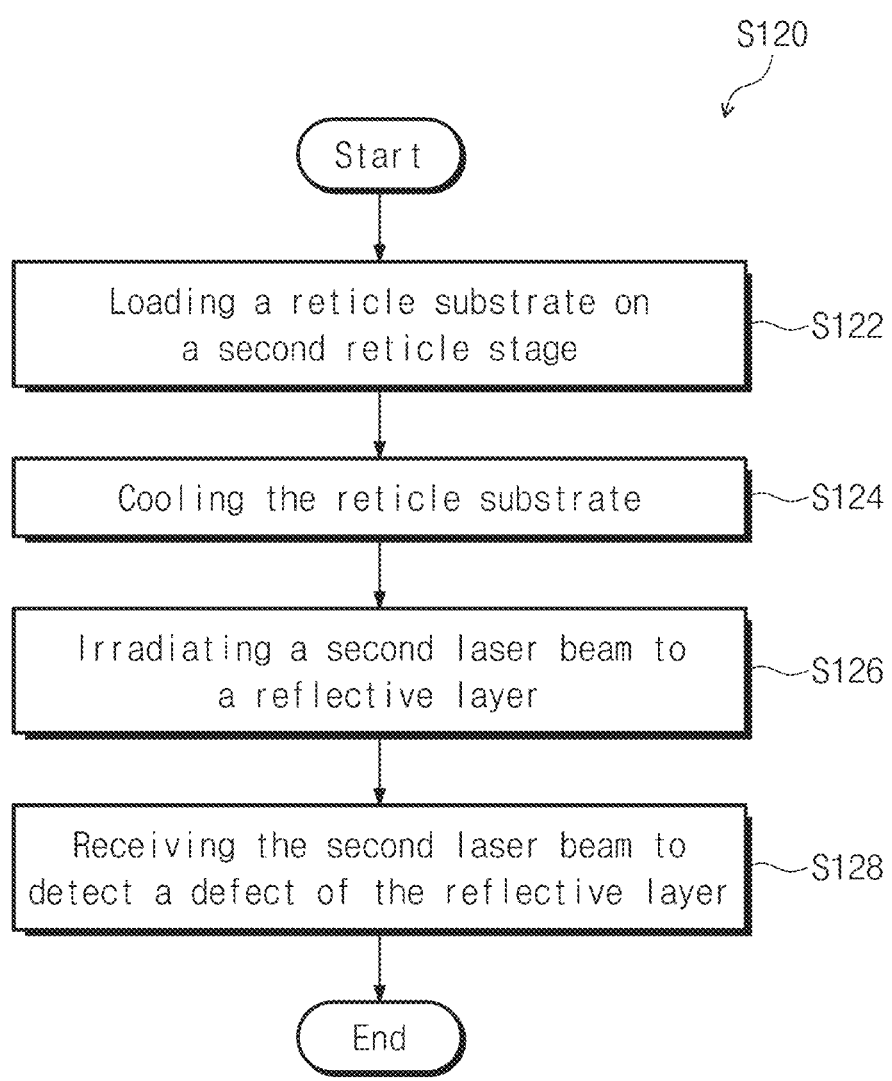
FIG. 14 is a flowchart illustrating a method for inspecting a reflective layer of FIG. 3, according to some embodiments of the inventive concepts.

FIG. 14 illustrates the operation S120 of inspecting the reflective layer 4 of FIG. 3, according to some embodiments of the inventive concepts.

Referring to FIG. 14, the reticle substrate 2 may be loaded on the second reticle stage 412 (S122). An interface device (not shown) may provide the reticle substrate 2 onto the second reticle stage 412. The reticle substrate 2 may be provided on the substrate cooler 411 of the second reticle stage 412.

Next, the reticle substrate 2 may be cooled by the substrate cooler 411 (S124). The substrate cooler 411 may cool the reticle substrate 2 to a temperature lower than the room temperature. For example, the substrate cooler 411 may cool the reticle substrate 2 to about 145 kelvins (K). The reflective layer 4 may be cooled to a temperature equal to the temperature of the reticle substrate 2.

Subsequently, the second laser 414 may irradiate the second laser beam 413 to the reflective layer 4 (S126). For example, in the operation S120 of inspecting the reflective layer 4, the power of the second laser beam 413 may be increased using the operation S124 of cooling the reticle substrate 2. The power of the second laser beam 413 may be about 0.49 W/cm² or more. For example, the second laser 414 may provide the second laser beam 413 having the power of about 0.87 W/cm². The second reticle stage 412 may move the reticle substrate 2 to scan the second laser beam 413 on the reflective layer 4. For example, the second laser beam 413 may include ArF ultraviolet light having a wavelength of about 193 nm. The second laser beam 413 may be scanned at a speed of about 12.3 mm/s.

The photodetector 419 may receive the second laser beam 413 and provide a signal to the controller 405 to detect a defect of the reflective layer 4 (S128). Since the power of the second laser beam 413 is increased, based on the signal from the photodetector 419, the controller 405 may obtain a surface image of the reflective layer 4, which has an excellent S/N ratio. In addition, controller 405 may use the signal from the photodetector 419 to detect the defect of the reflective layer 4 by using the surface image. A kind of the defect of the reflective layer 4 may be various. For example, the defect of the reflective layer 4 may include the particle 8. When the particle 8 is the defect of the reflective layer 4, the reticle cleaning module 420 of the reticle inspecting apparatus 40 may clean the reticle R to remove the particle 8. Alternatively, the defect of the reflective layer 4 may include a void 9 (see FIG. 11) of the reflective layer 4. Hereinafter, the defect of the reflective layer 4 which is the void 9 of FIG. 11 will be described.

Referring again to FIG. 10, the reticle inspecting apparatus 40 may determine whether the defect exists in the reflective layer 4 or not (S130). For example, referring to FIG. 17, in an embodiment, the controller 405 may obtain a reticle image Rimage of the reflective layer using the photodetector 419 in FIGS. 5 and 7. The controller 405, using signals from the photodetector 419, may determine a defect of a first type (e.g., void 9 in FIG. 11) exists in a portion of the reticle R (e.g., reflective layer 4) in response to the scattering intensity parameter I being greater than or equal to a first threshold Th1 and less than or second threshold Th2 (see location C); no defect exists in response to the scattering intensity parameter I being less than or equal to the first threshold Th1 and less than the second threshold (see location B); and a defect of a second type (e.g., particle 8 in FIG. 5) exists in response to the scattering intensity parameter I being greater than or equal to a second threshold Th2 (see location A). However, inventive concepts are not limited thereto.

When (and/or in response to) the defect exists in the reflective layer 4, the etching module of the reticle manufacturing apparatus 30 may etch the reflective layer 4 (S140). Thus, the reflective layer 4 may be removed from the reticle substrate 2. Thereafter, the operation S110 of forming the reflective layer 4, the operation S120 of inspecting the reflective layer 4, and the operation S130 of determining whether the defect exists in the reflective layer 4 or not may be repeated.

Referring to FIGS. 10 and 12, when the defect does not exist in the reflective layer 4, the thin layer depositing module of the reticle manufacturing apparatus 30 may form the absorption layer 7 on the reflective layer 4 (S150). The absorption layer 7 may include tantalum formed by a sputtering method or a layer having the tantalum.

Referring to FIGS. 10 and 13, the photoresist coating module of the reticle manufacturing apparatus 30 may form a photoresist PR on the absorption layer 7 (S160). The photoresist PR may be coated by a spin coating method.

Next, the reticle inspecting module 410 of the reticle inspecting apparatus 40 may inspect the photoresist PR (S170). The photoresist PR may be inspected by an optical inspection method. The operation S170 of inspecting the photoresist PR may be a operation of inspecting the photoresist PR and the absorption layer 7.

Figure 15:
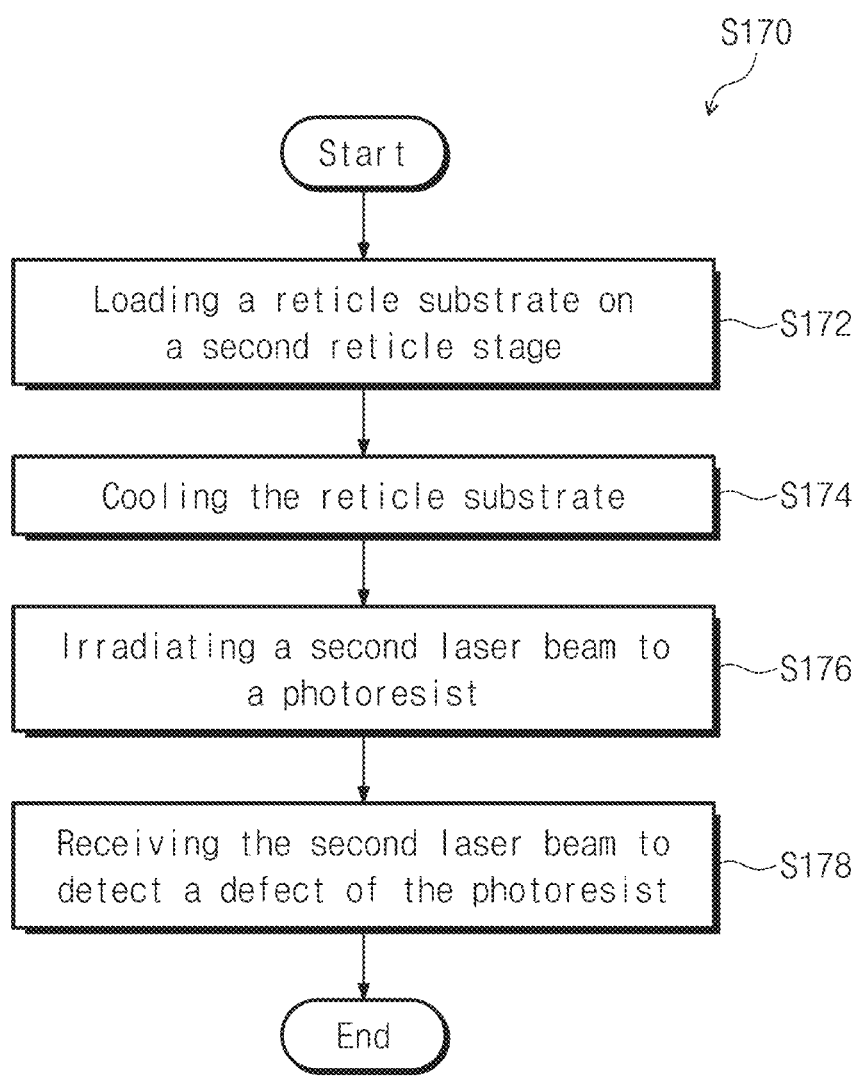
FIG. 15 is a flowchart illustrating a method for inspecting a photoresist of FIG. 13, according to some embodiments of the inventive concepts.

FIG. 15 illustrates the operation S170 of inspecting the photoresist PR of FIG. 13, according to some embodiments of the inventive concepts.

Referring to FIG. 15, the operation S170 of inspecting the photoresist PR may be similar to the operation S120 of inspecting the reflective layer 4.

The reticle substrate 2 may be loaded on the second reticle stage 412 of the reticle inspecting module 410 (S172). An interface device may provide the reticle substrate 2 on the substrate cooler 411 of the second reticle stage 412.

Next, the reticle substrate 2 may be cooled by the substrate cooler 411 (S174). For example, the substrate cooler 411 may cool the reticle substrate 2 to about 145 kelvins (K) lower than the room temperature.

Subsequently, the second laser 414 may irradiate the second laser beam 413 to the photoresist PR (S176). For example, in the operation S170 of inspecting the photoresist PR, the power of the second laser beam 413 may be increased using the operation S174 of cooling the reticle substrate 2. The power of the second laser beam 413 may be about 0.49 W/cm$^2$ or more. The second laser 414 may provide the second laser beam 413 having the power of about 0.87 W/cm$^2$. The second laser beam 413 may include ArF ultraviolet light having a wavelength of about 193 nm. The second laser beam 413 may be scanned at a speed of about 12.3 mm/s. The second laser beam 413 may be provided without chemical modification and physical deformation of the photoresist PR. The photoresist PR may have photosensitivity with respect to light having a wavelength in an EUV range (e.g., 13.5 nm). For example, the second laser beam 413 may have a wavelength in an ultraviolet range (e.g., 193 nm) to a visible light range (e.g., 700 nm), and the photosensitivity of the photoresist PR may be reduced and/or minimized.

The controller 405 may control the photodetector 419 to receive the second laser beam 413 to detect a defect of the photoresist PR (S178). The controller 405 may use photodetector 419 to obtain an image of the photoresist PR. The defect of the photoresist PR may include a void 9 or a particle 8.

Referring again to FIG. 10, the reticle inspecting apparatus 40 may determine whether the defect exists in the photoresist PR or not (S180).

For example, referring to FIG. 17, in an embodiment, the controller 405 may determine whether the defect exists in the photoresist using a operation that is similar to determining whether the defect exists in the reflective layer, except the reticle image Rimage is made for the photoresist PR. The controller 405 may obtain a reticle image Rimage of the photoresist using the photodetector 419 in FIGS. 5 and 7. The controller 405, using signals from the photodetector 419, may determine a defect of a first type (e.g., void 9 in FIG. 11) exists in a portion of the reticle R (e.g., photoresist) in response to the scattering intensity parameter I being greater than or equal to a first threshold Th1 and less than or second threshold Th2 (see location C); no defect exists in response to the scattering intensity parameter I being less than or equal to the first threshold Th1 and less than the second threshold (see location B); and a defect of a second type (e.g., particle 8 in FIG. 5) exists in response to the scattering intensity parameter I being greater than or equal to a second threshold Th2 (see location A). However, inventive concepts are not limited thereto.

When the defect exists in the photoresist PR, the photoresist PR may be removed by an ashing apparatus or a cleaning apparatus (S190). Thereafter, the operation S160 of forming the photoresist PR, the operation S170 of inspecting the photoresist PR, and the operation S180 of determining whether a defect exists in the photoresist PR or not may be repeated.

When the defect does not exist in the photoresist PR, the photolithography module of the reticle manufacturing apparatus 30 may pattern the photoresist PR (S192).

Referring to FIGS. 3 and 10, the absorption layer may be etched using the patterned photoresist PR as an etch mask by the etching module to form the absorption pattern 6 (S194). The photoresist PR may be removed. The process for manufacturing the reticle R may be completed, and then, the reticle R may be provided into the exposure apparatus 20.

Referring again to FIG. 9, the exposure apparatus 20 may perform the exposure process on a substrate W by using the reticle R (S200). In some embodiments, the reticle R may include an EUV reticle, and the exposure process may include an EUV exposure process. When the exposure process is performed for a certain time or failure of the exposure process occurs, the reticle R may be replaced.

Next, the reticle R may be inspected by the reticle inspecting apparatus 40 (S300).

Figure 16:
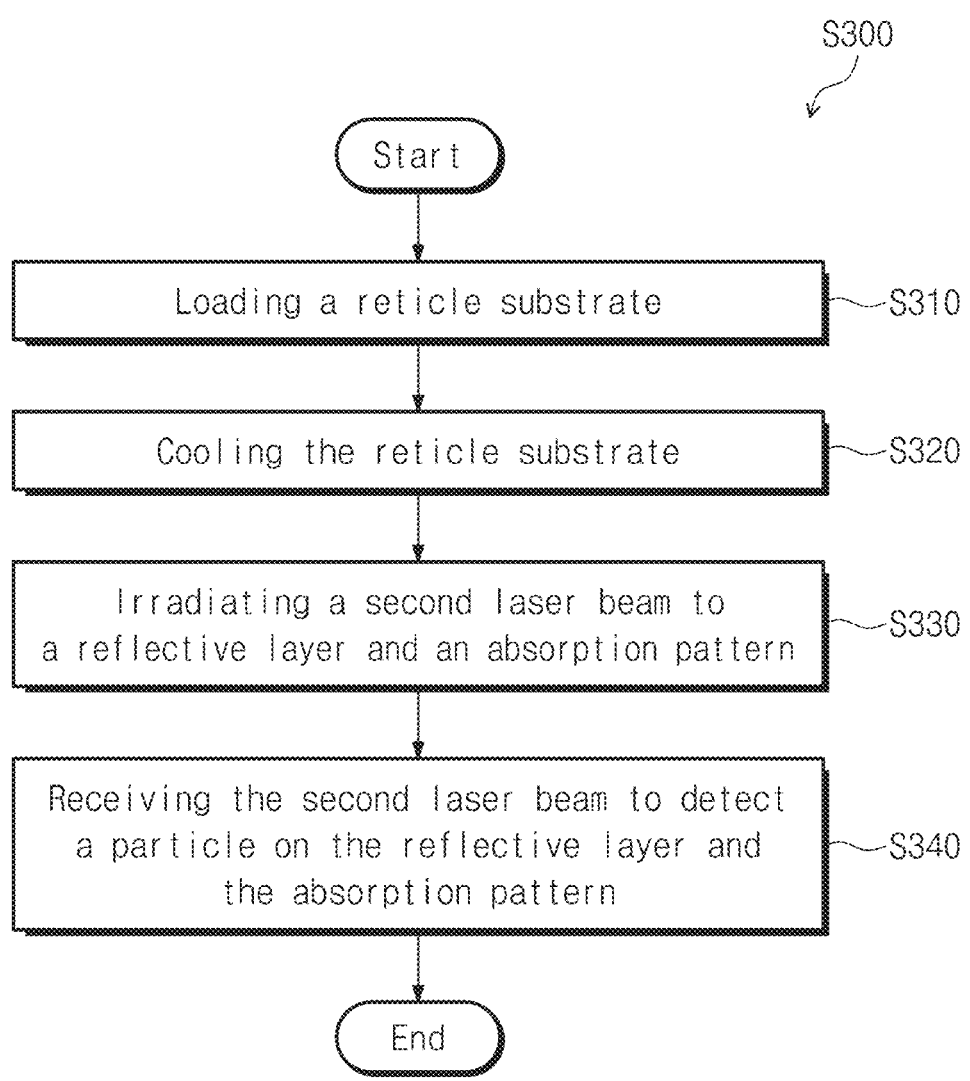
FIG. 16 is a flowchart illustrating a method for inspecting the reticle of FIG. 3, according to some embodiments of the inventive concepts.

FIG. 16 illustrates the operation S300 of inspecting the reticle R of FIG. 3, according to some embodiments of the inventive concepts.

Referring to FIG. 16, the operation S300 of inspecting the reticle R may be similar to the operation S120 of inspecting the reflective layer 4 and the operation S170 of inspecting the photoresist PR.

The reticle substrate 2 of the reticle R may be loaded on the second reticle stage 412 (S310). The reticle substrate 2 may be provided on the substrate cooler 411.

Next, the substrate cooler 411 may cool the reticle substrate 2 (S320). The substrate cooler 411 may cool the reticle substrate 2 to a temperature lower than the room temperature. For example, the substrate cooler 411 may cool the reticle substrate 2 to about 145 kelvins (K). The reflective layer 4 and the absorption pattern 6 may be cooled to a temperature equal to the temperature of the reticle substrate 2.

Subsequently, the second laser 414 may irradiate the second laser beam 413 to the reflective layer 4 and the absorption pattern 6 (S330). For example, in the operation S300 of inspecting the reticle R, the power of the second laser beam 413 may be increased using the operation S320 of cooling the reticle substrate 2. The power of the second laser beam 413 may be about 0.49 W/cm$^2$ or more. For example, the second laser 414 may provide the second laser beam 413 having the power of about 0.87 W/cm$^2$. The second laser beam 413 may include ArF ultraviolet light having a wavelength of about 193 nm. The second laser beam 413 may be scanned at a speed of about 12.3 mm/s.

The photodetector 419 may receive the second laser beam 413 to detect a particle 8 on the reflective layer 4 and the absorption pattern 6 (S340). The photodetector 419 may obtain a surface image of the reflective layer 4 and the absorption pattern 6 of the reticle R, which has an excellent S/N ratio. In addition, the photodetector 419 may detect the particle 8 by using the surface image.

Referring again to FIG. 9, the reticle inspecting apparatus 40 may determine whether the particle 8 exists on the reticle R or not (S400).

When the particle 8 exists on the reticle R, the reticle R may be cleaned by the reticle cleaning module 420 (S500). The reticle R may be cleaned by a wet cleaning method. Thereafter, the operation S300 of inspecting the reticle R and the operation S400 of determining whether the particle 8 exists on the reticle R or not may be repeated.

When the particle 8 does not exist on the reticle R, the reticle R may be stored in the reticle storing apparatus 50 (S600). A nitrogen (N2) gas may be provided to the reticle R in the reticle storing apparatus 50. The nitrogen gas may prevent oxidation of the reticle R.

In the method for inspecting a reticle according to the embodiments of the inventive concepts, the reticle substrate may be cooled to increase the S/N ratio of the optical inspection and to reduce and/or minimize damage of the reflective layer of the reticle.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for inspecting a reticle, the method comprising:
    loading the reticle on a stage, the reticle including a reticle substrate and a reflective layer on the reticle substrate;
    cooling the reticle substrate;
    irradiating a laser beam to the reflective layer on the reticle substrate;
    receiving the laser beam using a photodetector to obtain an image of the reflective layer; and
    detecting whether a particle defect exists on the reflective layer or a void defect exists in the reflective layer based on the image of the reflective layer, wherein
    the reticle substrate is cooled below 145 kelvins (K) to decrease a specific heat capacity of the reflective layer and to increase a power of the laser beam.

2. The method of claim 1, wherein the laser beam has power of 0.87 W/cm$^2$.

3. The method of claim 1, wherein the laser beam includes ArF ultraviolet light.

4. The method of claim 1, wherein the laser beam is scanned at a speed of 12.3 mm/s.

5. The method of claim 1, wherein the reticle includes an extreme ultraviolet (EUV) reticle.

6. The method of claim 5, wherein the reflective layer of the EUV reticle includes a molybdenum layer on a silicon layer.

7. The method of claim 5, wherein the EUV reticle further includes an absorption pattern on the reflective layer.

8. The method of claim 1, wherein the stage includes a cooler for cooling the reticle substrate.

9. The method of claim 8, wherein the cooler includes a Peltier device or an air blowing device.

* * * * *